(12) United States Patent
Hong

(10) Patent No.: US 8,547,145 B2
(45) Date of Patent: Oct. 1, 2013

(54) POWER-UP SIGNAL GENERATION CIRCUIT OF SEMICONDUCTOR APPARATUS

(75) Inventor: Yun Seok Hong, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 1 day.

(21) Appl. No.: 13/333,090

(22) Filed: Dec. 21, 2011

(65) Prior Publication Data

US 2012/0249228 A1 Oct. 4, 2012

(30) Foreign Application Priority Data

Mar. 28, 2011 (KR) ........................ 10-2011-0027580

(51) Int. Cl.
*H03L 7/00* (2006.01)
(52) U.S. Cl.
USPC .............................. 327/143; 327/80; 327/87

(58) Field of Classification Search
USPC ............... 327/77, 78, 80–82, 87, 88, 99, 143, 327/198
See application file for complete search history.

(56) References Cited

U.S. PATENT DOCUMENTS 5,825,220 A * 10/1998 Kinugasa et al. ............. 327/143
2007/0159222 A1 * 7/2007 Ogai et al. .................... 327/143

* cited by examiner

*Primary Examiner* — Long Nguyen
(74) *Attorney, Agent, or Firm* — William Park & Associates Patent Ltd.

(57) ABSTRACT

A power-up signal generation circuit of a semiconductor apparatus includes a driver configured to generate a power-up signal in response to a first voltage. The power-up signal generation circuit may also comprise a power control unit configured to provide the first voltage or a second voltage as a power supply voltage to the driver in response to the power-up signal.

16 Claims, 1 Drawing Sheet

POWER-UP SIGNAL GENERATION CIRCUIT OF SEMICONDUCTOR APPARATUS

CROSS-REFERENCES TO RELATED APPLICATION

The present application claims priority under 35 U.S.C. §119(a) to Korean application number 10-2011-0027580 filed on Mar. 28, 2011 in the Korean Intellectual Property Office, which is incorporated by reference in its entirety.

BACKGROUND

1. Technical Field

The present invention relates to a semiconductor apparatus, and more particularly, to a power-up signal generation circuit.

2. Related Art

A semiconductor apparatus generates a variety of internal voltages VPERI and VCORE using an external voltage VDD.

The semiconductor apparatus detects whether the above-described voltages approach a predetermined level or not, and generates power-up signals for the respective internal voltages. Accordingly, the semiconductor apparatus performs a reset process and then performs various operations after various circuitry have been reset to a known state.

For example, referring to FIG. 1A, a power-up signal PWRUP may be generated when an internal voltage VPERI approaches a predetermined level, that is, a trigger level (for example, 0.7-0.8V).

At this time, the trigger level corresponds to the level of the internal voltage, at which the power-up signal PWRUP changes.

A minimum level of the internal voltage VPERI is required for performing stable operation in the semiconductor apparatus. The minimum level may be, for example, a target level of 1.35V.

In this case, since the trigger level is lower than the target level of the internal voltage VPERI, it is highly likely that a reset error may occur in the semiconductor apparatus.

Therefore, in order to prevent such an error, the trigger level of the internal voltage VPERI may be increased to 1.1-1.2V, as shown in FIG. 1B.

In this method, however, when the level of the internal voltage VPERI temporarily decreases during normal operation, the is power-up signal PWRUP may be regenerated to reset the semiconductor apparatus.

SUMMARY

A power-up signal generation circuit of a semiconductor apparatus, which is capable of increasing the trigger level of a power-up signal and preventing the regeneration of a power-up signal during a normal operation, is described.

In one embodiment of the present invention, a power-up signal generation circuit of a semiconductor apparatus includes a driver configured to generate a power-up signal in response to a first voltage, where a power-up signal is generated from the first power-up signal. The power-up signal generation circuit may also comprise a power control unit configured to provide the first voltage or a second voltage as a power supply voltage to the driver in response to the power-up signal.

In another embodiment of the present invention, a power-up signal generation circuit includes a driver configured to generate a power-up signal in response to a power supply voltage and an input voltage, and a power control unit configured to change the power supply voltage to a voltage having the same level as the input voltage after the power-up signal is activated.

In another embodiment of the present invention, a power-up signal generation circuit includes a driver configured to generate a is preliminary power-up signal in response to a first voltage, a signal combination unit configured to combine the preliminary power-up signal and a test mode signal and generate a power-up signal, and a power control unit configured to provide the first voltage or a second voltage as a power supply voltage to the driver in response to the power-up signal.

In another embodiment of the present invention, a method of generating a power-up signal in a semiconductor apparatus, may comprise generating a first power-up signal in response to a first voltage, wherein a power-up signal is generated from the first power-up signal, and provide the first voltage or a second voltage in response to the power-up signal as a power supply voltage to generate the first power-up signal.

BRIEF DESCRIPTION OF THE DRAWINGS

Features, aspects, and embodiments are described in conjunction with the attached drawings.

DETAILED DESCRIPTION

A power-up signal generation circuit of a semiconductor apparatus according to various embodiments of the present invention will be described below with reference to the accompanying drawings.

A semiconductor apparatus may generate various internal voltages such as, for example, VPERI and VCORE using an external voltage VDD.

The semiconductor apparatus detects whether the above-described voltages approach a trigger level or not, and completes power-up operations for the respective voltages, that is, generates power-up signals. Accordingly, the semiconductor apparatus performs a reset process and then performs various operations related to the function of the semiconductor apparatus.

The trigger level corresponds to the level of an internal voltage at which a power-up signal PWRUP is generated.

That is, the trigger level is where the power-up signal PWRUP changes from a high level to a low level.

A power-up signal generation circuit according to one embodiment is configured to generate power-up signals PWRUP for various voltage levels requiring a power-up operation, which include internal voltages VPERI and VCORE.

In this embodiment, a case in which a power-up signal PWRUP for the internal voltage VCORE is generated will be taken as an example.

Figure 1:
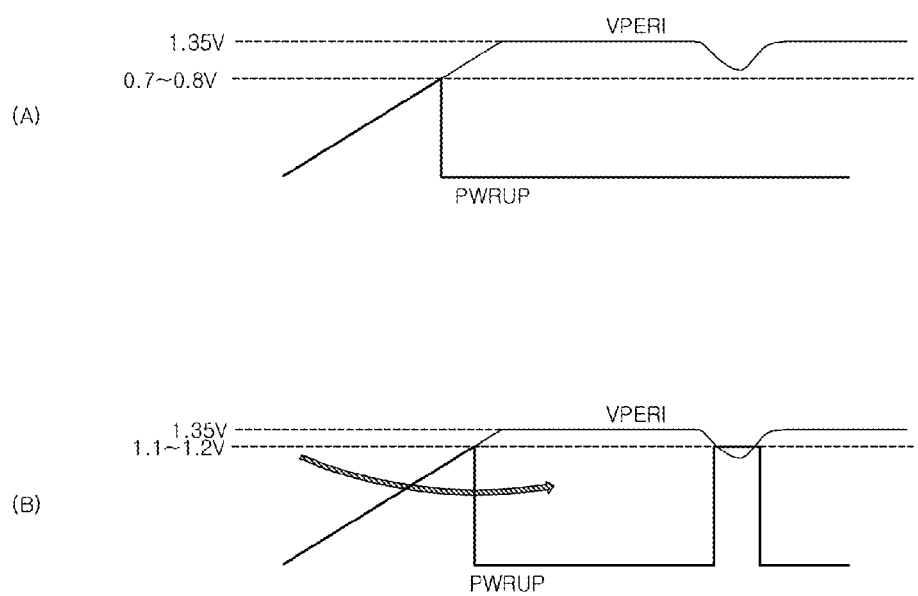
FIGS. 1A and 1B are waveform diagrams showing the waveform of a power-up signal in a convention semiconductor apparatus.
Figure 2:
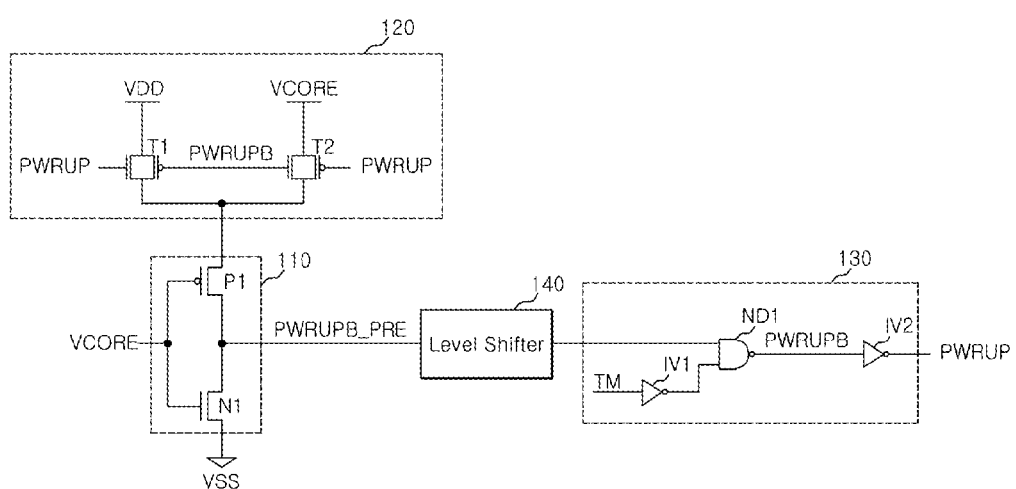
FIG. 2 is a circuit diagram of a power-up signal generation circuit according to one embodiment of the invention.

Referring to FIG. 2, the power-up signal generation circuit 100 of the semiconductor apparatus according to an embodiment of the invention includes a driver 110, a power control unit 120, a level shifter 140, and a signal combination unit 130.

The driver 110 is configured to drive an input voltage, that is, a first voltage, and generate a preliminary power-up signal PWRUP_PRE.

The driver 110 includes transistors P1 and N1 coupled in an inverter structure.

The power control unit 120 is configured to provide a second voltage as a power supply voltage of the driver 110 before a power-up operation is completed, and provide the first voltage as a power supply voltage of the driver 110 after the power-up operation is completed.

The power control unit 120 is configured to provide the first or second voltage as a power supply voltage of the driver 110, in response to power-up signals PWRUP and PWRUPB.

The power-up signal PWRUP is a signal obtained by inverting the power-up signal PWRUPB.

The first voltage may include an inverter voltage VCORE, and the second voltage may include an external voltage VDD.

The power control unit 120 includes pass gates T1 and T12.

The pass gate T1 has NMOS and PMOS gates configured to receive the power-up signals PWRUP and PWRUPB, respectively, a source configured to receive an external voltage VDD, and a drain is coupled to a source of a transistor P1 of the driver 110.

The pass gate T2 has NMOS and PMOS gates configured to receive the power-up signals PWRUPB and PWRUP, respectively, a source configured to receive an internal voltage VCORE, and a drain coupled to the source of the transistor P1 of the driver 110.

The level shifter 140 is configured to shift the preliminary power-up signal PWRUP_PRE having a level of the internal voltage VCORE to the level of the external voltage VDD.

The signal combination unit 130 is configured to combine an output of the level shifter 140 and a test mode signal TM and output the power-up signals PWRUP and PWRUPB.

The signal combination unit 130 includes a NAND gate ND1 and inverters IV1 and IV2.

The test mode signal TM may be used for tests that may not require generating the PWRUP signal from the internal voltage VCORE, for example.

For example, when the test mode signal TM is asserted to a high level to perform a specific test mode, the NAND gate ND1 outputs a high-level signal regardless of the level of the internal voltage VCORE. Accordingly, the power-up signal PWRUP may be at a low level as long as the test mode signal TM is asserted to a high level.

Therefore, since the change of the power-up signal PWRUP is prevented, the specific test mode in which the internal voltage VCORE is not used may be performed.

The power-up operation of the power-up signal generation circuit according to an embodiment of the invention will be described as follows.

During the initial operation, the internal voltage VCORE is at a low level, but the external voltage VDD is at a normal level. Therefore, the driver 110 outputs the preliminary power-up signal PWRUP_PRE at a high level.

The preliminary power-up signal PWRUP_PRE is passed through the level shifter 140 and output at a high level of the external voltage VDD. Accordingly, the signal combination unit 130 outputs a high-level power-up signal PWRUP.

That is, during the initial operation when the internal voltage VCORE is ramping up, the power-up signal PWRUP has a high level.

Since the power-up signal PWRUP is at a high-level, the power control unit 120 provides the external voltage VDD as a power supply voltage to the driver 110.

When the internal voltage VCORE rises to approach a predetermined trigger level, the power-up signal PWRUP changes to a low level. That is, as the power-up signal PWRUP is generated, an initial normal power-up operation is performed.

Since the power-up signal PWRUP changed to a low level, the power control unit 120 provides the internal voltage VCORE as a power supply voltage to the driver 110.

That is, the source and gate levels of the driver 110 are is equalized.

Therefore, although the internal voltage VCORE is varied, the driver 110 maintains the preliminary power-up signal PWRUP_PRE to a low level.

Accordingly, although the internal voltage VCORE may fluctuate after the power-up signal PWRUP was generated at the initial stage, the power-up signal PWRUP is not regenerated.

According to various embodiments of the present invention, the reset operation of the semiconductor apparatus may be stably performed, and the regeneration of the power-up signal may be substantially prevented.

While certain embodiments have been described above, it will be understood to those skilled in the art that the embodiments described are by way of example only. Accordingly, the power-up signal generation circuit described should not be limited based on the described embodiments. Rather, the power-up signal generation circuit described should only be limited in light of the claims that follow when taken in conjunction with the above description and accompanying drawings.

What is claimed:

1. A power-up signal generation circuit of a semiconductor apparatus comprising:
    a driver configured to generate a power-up signal using a power supply voltage in response to a first voltage; and
    a power control unit configured to provide the first voltage as the power supply voltage to the driver after the power-up signal is activated, and provide a second voltage as the power supply voltage to the driver before the power-up signal is activated,
    wherein a level of the second voltage is different from a level of the first voltage.

2. The power-up signal generation circuit according to claim 1, wherein the first voltage comprises one of internal voltages of the semiconductor apparatus.

3. The power-up signal generation circuit according to claim 1, wherein the second voltage is supplied from a node external to the semiconductor apparatus.

4. A power-up signal generation circuit comprising:
    a driver configured to generate a power-up signal in response to a power supply voltage and an input voltage; and
    a power control unit configured to provide an external voltage as the power supply voltage to the driver before the power-up signal is asserted, and change the power supply voltage to a voltage having the same level as the input voltage after the power-up signal is asserted,
    wherein a level of the external voltage is different from a level of the input voltage.

5. The power-up signal generation circuit according to claim 4, wherein the external voltage is supplied from a node external to the semiconductor apparatus.

6. The power-up signal generation circuit according to claim 4, wherein the input voltage comprises one of internal voltages of the semiconductor apparatus.

7. A power-up signal generation circuit comprising:
    a driver configured to generate a preliminary power-up signal in response to a first voltage;
    a signal combination unit configured to combine the preliminary power-up signal and a test mode signal and generate a power-up signal; and a power control unit configured to provide the first voltage or a second voltage as a power supply voltage to the driver in response to the power-up signal.

8. The power-up signal generation circuit according to claim 7, further comprising a level shifter configured to shift the preliminary power-up signal to the level of the second voltage and provide the shifted signal to the signal combination unit.

9. The power-up signal generation circuit according to claim 7, wherein the power control unit provides the first voltage as the power supply voltage to the driver after the power-up signal is asserted.

10. The power-up signal generation circuit according to claim 7, wherein the power control unit provides the second voltage as the power supply voltage to the driver before the power-up signal is asserted.

11. The power-up signal generation circuit according to claim 7, wherein the first voltage comprises one of internal voltages of the semiconductor apparatus.

12. The power-up signal generation circuit according to claim 7, wherein the second voltage comprises an external voltage, wherein the external voltage is supplied from a node external to the semiconductor apparatus.

13. The power-up signal generation circuit according to claim 7, comprising circuitry to force the power-up signal to remain asserted during a test mode.

14. A method of generating a power-up signal in a semiconductor apparatus, comprising:
generating a first power-up signal in response to a first voltage, wherein a power-up signal is generated from the first power-up signal; and
providing the first voltage as a power supply voltage to generate the first power-up signal after the power-up signal is activated, and providing a second voltage as the power supply voltage to generate the first power-up signal before the power-up signal is activated,
wherein a level of the second voltage is different from a level of the first voltage.

15. The method of generating a power-up signal in a semiconductor apparatus according to claim 14, wherein the first voltage comprises one of internal voltages of the semiconductor apparatus.

16. The method of generating a power-up signal in a semiconductor apparatus according to claim 14, wherein the second voltage comprises an external voltage, wherein the external voltage is supplied from a node external to the semiconductor apparatus.

* * * * *